US010115750B2

(12) United States Patent
Gordon et al.

(10) Patent No.: US 10,115,750 B2
(45) Date of Patent: Oct. 30, 2018

(54) SENSORS INCLUDING COMPLEMENTARY LATERAL BIPOLAR JUNCTION TRANSISTORS

(71) Applicant: INTERNATIONAL BUSINESS MACHINES CORPORATION, Armonk, NY (US)

(72) Inventors: Michael S. Gordon, Yorktown Heights, NY (US); Tak H. Ning, Yorktown Heights, NY (US); Kenneth P. Rodbell, Sandy Hook, CT (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/601,020

(22) Filed: May 22, 2017

(65) Prior Publication Data
US 2017/0263656 A1   Sep. 14, 2017

Related U.S. Application Data

(62) Division of application No. 14/884,725, filed on Oct. 15, 2015, now Pat. No. 9,659,979.

(51) Int. Cl.
*H01L 27/144* (2006.01)
*H01L 31/118* (2006.01)
*H01L 31/18* (2006.01)

(52) U.S. Cl.
CPC ........ *H01L 27/1443* (2013.01); *H01L 31/118* (2013.01); *H01L 31/18* (2013.01)

(58) Field of Classification Search
CPC ................................ H01L 31/118; H01L 31/18
See application file for complete search history.

(56) References Cited

U.S. PATENT DOCUMENTS 4,633,289 A * 12/1986 Yuan-Tai Chen ........................... H01L 21/26513
257/372
4,760,433 A   7/1988 Young et al.
(Continued)

FOREIGN PATENT DOCUMENTS

CN   102466806 A   5/2012
CN   102466806 A   5/2012
(Continued)

OTHER PUBLICATIONS

List of IBM Patents or Patent Applications Treated as Related, dated May 22, 2017, pp. 1-2.
(Continued)

*Primary Examiner* — Eugene Lee
(74) *Attorney, Agent, or Firm* — L. Jeffrey Kelly; Otterstedt, Ellenbogen & Kammer, LLP

(57) ABSTRACT

An integrated radiation sensor for detecting the presence of an environmental material and/or condition includes a sensing structure and first and second lateral bipolar junction transistors (BJTs) having opposite polarities. The first lateral BJT has a base that is electrically coupled to the sensing structure and is configured to generate an output signal indicative of a change in stored charge in the sensing structure. The second lateral BJT is configured to amplify the output signal of the first bipolar junction transistor. The first and second lateral BJTs, the sensing structure, and the substrate on which they are formed comprise a monolithic structure.

9 Claims, 10 Drawing Sheets

(56) References Cited

U.S. PATENT DOCUMENTS

| | | | |
|---|---|---|---|
| 5,315,144 A | 5/1994 | Cherne | |
| 5,760,445 A * | 6/1998 | Diaz | H01L 27/0251 257/356 |
| 8,080,805 B2 | 12/2011 | Gordon | |
| 8,198,595 B2 | 6/2012 | Polishchuk | |
| 8,476,683 B2 | 7/2013 | Gordon | |
| 8,895,995 B2 | 11/2014 | Cai | |
| 8,912,030 B2 | 12/2014 | Cai | |
| 8,980,667 B2 | 3/2015 | Cai | |
| 9,040,929 B2 | 5/2015 | Cai | |
| 2003/0102485 A1 | 6/2003 | Chen et al. | |
| 2007/0141794 A1 * | 6/2007 | Morris | H01L 29/1087 438/294 |
| 2009/0309167 A1 | 12/2009 | Russ et al. | |
| 2012/0098098 A1 | 4/2012 | Pendharkar et al. | |
| 2012/0313216 A1 | 12/2012 | Cai et al. | |
| 2013/0242448 A1 | 9/2013 | Salcedo et al. | |
| 2014/0008524 A1 | 1/2014 | Hayashi et al. | |
| 2014/0027871 A1 | 1/2014 | Cai et al. | |
| 2014/0084301 A1 | 3/2014 | Cai et al. | |
| 2014/0154845 A1 | 6/2014 | Cai et al. | |
| 2015/0137190 A1 | 5/2015 | Kang et al. | |
| 2015/0270335 A1 | 9/2015 | Sadovnikov et al. | |
| 2016/0153932 A1 | 6/2016 | Eklund et al. | |
| 2016/0379975 A1 | 12/2016 | Cai et al. | |
| 2017/0110492 A1 | 4/2017 | Gordon | |

FOREIGN PATENT DOCUMENTS

| | | |
|---|---|---|
| EP | 0740338 A2 | 10/1996 |
| EP | 2381273 | 10/2011 |

OTHER PUBLICATIONS

G. Verzellesi et al, 'BJT-based detector on high-resistivity silicon with integrated biasing structure', Nuclear Instruments & Methods in Physics Research. Section A: Accelerators, Spectrometers, Detectors, and Associated Equipment, vol. 567, No. 1, pp. 285-289, 2006, Elsevier BV.

Intellectual Property Office of the United Kingdom, Combined Search and Examination Report, UK Patent Application GB1616634.0, dated Jan. 20, 2017, pp. 1-8.

* cited by examiner

SENSORS INCLUDING COMPLEMENTARY LATERAL BIPOLAR JUNCTION TRANSISTORS

CROSS-REFERENCE TO RELATED APPLICATIONS

This patent application is a divisional of U.S. patent application Ser. No. 14/884,725 filed Oct. 15, 2015, entitled "SENSORS INCLUDING COMPLEMENTARY LATERAL BIPOLAR JUNCTION TRANSISTORS." The complete disclosure of the aforementioned U.S. patent application Ser. No. 14/884,725 is expressly incorporated herein by reference in its entirety for all purposes.

BACKGROUND

The present disclosure relates generally to the electrical, electronic and computer arts and, more particularly, to integrated sensors.

Advancements in microelectronics have facilitated the introduction of numerous applications that benefit society in many ways. In addition to mainstream applications in conventional consumer electronics, microelectronics can be utilized in remote areas of the population. Given the ever-increasing globalization of society, precise acquisition, (near) real-time processing and analyses of tremendous amounts of information are in high demand. One example is the use of sensors that can detect and provide relevant environmental information, such as, but not limited to, radiation levels, inorganic particles, biological entities, etc., to ensure safety, security, and stability of environmental control. In addition, with advancements in mobile technology, technological benefits have been achieved by integrating such sensors into personal devices to provide real-time and customized readout of information.

Conventionally, different types of sensors are fabricated for the detection of corresponding different types of materials/substances. For example, Geiger counters are used to detect radiation dose, using ionization produced in a Geiger-Müller tube, and provide a real-time and semi-quantitative readout. However, Geiger counters have limited success in measuring high radiation rates and in measuring the energy of incident radiation. Personal radiation dosimeters in the form of wearable badges and the like are available but cannot provide a real-time indication of radiation; rather, such personal radiation dosimeters provide an indication of accumulated radiation or total radiation dose received. Biosensors, which often combine a biological component with a physicochemical detector, depending on the type of material to be detected, often require a certain amount of time for readout due to the reaction/detection mechanism. Moreover, better resolution/sensitivity requires longer processing time, which sometimes involves special instruments only available in laboratories, thus limiting the portability of biosensors.

Solid-state sensors used as dosimeters, biosensors, and magnetometers offer features such as compactness, cost efficiency, easy integration with existing semiconductor processes, and good performance with respect to sensitivity and resolution. Most solid-state sensors are single devices that operate as the sensor and output unit at the same time. Additional circuit design is required to provide amplification of the sensing signal. Conventional MOSFET sensors have limited sensitivity and resolution due to the inability to amplify their output currents.

Bipolar junction transistors include emitter, collector and base regions. A biasing voltage applied between a base contact and an emitter contact allows control of collector current. Bipolar junction transistors can be employed as sensors, switches or amplifiers. The operation of heterojunction bipolar transistors, which are a type of bipolar junction transistors, is based on a bandgap difference between the emitter and base.

BRIEF SUMMARY

Techniques are provided for forming complementary lateral bipolar junction transistor (LBJT) structures of opposite polarities to provide sensitive radiation sensors having built-in sensing signal amplification. Complementary lateral BJT structures and their methods of use are further provided in connection with detecting, for example, a variety of high-energy particles, as discussed below.

In one aspect, an exemplary integrated sensor includes a sensing structure and a first lateral bipolar junction transistor having a base that is electrically coupled to the sensing structure. The first lateral bipolar junction transistor is configured to generate an output signal indicative of a change in stored charge in the sensing structure resulting from a presence of an environmental property. A second lateral bipolar junction transistor is adjacent and electrically connected to the first lateral bipolar junction transistor. The second lateral bipolar junction transistor is configured to amplify the output signal of the first lateral bipolar junction transistor. The first lateral bipolar junction transistor and the second lateral bipolar junction transistor have opposite polarities. The integrated sensor further includes a substrate. The first lateral bipolar junction transistor, the second lateral bipolar junction transistor and the substrate form a monolithic structure.

In another aspect, an exemplary method for fabricating a sensor includes obtaining a substrate including a substrate layer, a semiconductor layer, and an electrically insulating layer between and adjoining the substrate layer and the semiconductor layer, and forming a first lateral bipolar junction transistor having a first polarity on the substrate. The first lateral bipolar junction transistor is configured to generate an output signal indicative of a change in stored charge in the electrically insulating layer resulting from ionizing radiation. The method further includes forming a second lateral bipolar junction transistor having a second polarity opposite to the first polarity on the substrate, the second bipolar junction transistor being configured to amplify the output signal of the first bipolar junction transistor. The first and second bipolar junction transistors are formed adjacent to one another on the substrate. An electrical connection is formed between an output terminal of the first lateral bipolar junction transistor and a base of the second lateral bipolar junction transistor.

In a still further aspect, an exemplary method for fabricating a sensor includes obtaining a semiconductor substrate, forming a first lateral bipolar junction transistor having a first polarity on the semiconductor substrate, and forming a sensing structure on a base of the first lateral bipolar junction transistor. The first lateral bipolar junction transistor is configured to generate an output signal indicative of a change in stored charge in the sensing structure. The method further includes forming a second lateral bipolar junction transistor having a second polarity opposite to the first polarity on the semiconductor substrate. The second lateral bipolar junction transistor is configured to amplify the output signal of the first lateral bipolar junction transistor.

The first and second lateral bipolar junction transistors are formed adjacent to one another on the substrate. An electrical connection is formed between an output terminal of the first lateral bipolar junction transistor and a base of the second lateral bipolar junction transistor.

A method of detecting radiation includes providing a sensor substantially as described above, subjecting the sensor to ionizing radiation, and obtaining an amplified output signal from the second (amplifying) lateral bipolar junction transistor.

Techniques as disclosed herein can provide substantial beneficial technical effects. By way of example only and without limitation, one or more embodiments may provide one or more of the following advantages:
powered and unpowered functionality;
the sensing/detection layer/structure of the sensor can be readily custom engineered for a given application;
effective radiation detection through the use of a monolithically integrated amplifier unaffected by charges created by ionizing radiation;
amplification of the sensing signal with gains that can be controlled via material/device engineering.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative silicon-based sensors that include complementary lateral BJTs having opposite polarities. An NPN transistor is functional as a sensing device in some embodiments while the PNP transistor is functional as an amplifier. In other embodiments, an NPN inverted lateral BJT is functional as a sensing device while a PNP inverted lateral BJT is functional as an amplifier The output (emitter) terminal of an NPN lateral BJT may, for example, be connected to the input (base) terminal of the PNP lateral BJT for applications that require or utilize large current drive. The sensing devices and amplifiers are formed on a common substrate using complementary metal-oxide-semiconductor (CMOS)-compatible processes. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a sensor which comprises an amplifier monolithically integrated with a sensing device on a common substrate for providing sensing signal amplification. A sensor can be configured as an efficient detector of one or more environmental properties, including, but not limited to, radiation, biological and chemical entities, through appropriate structure and/or material engineering. In one or more embodiments, the sensing device, which utilizes a charge detection mechanism, offers at least one of the following advantages over FDSOI MOSFET counterparts:
no requirement of thin silicon layer (e.g., less than 40 nm);
the sensing/detection layer of the sensor can be readily custom engineered for a given application;
superior charge retention rendered by using oxide as a sensing layer;
amplification of the sensing signal with large gains that can be controlled via material/device engineering.

Figure 1:
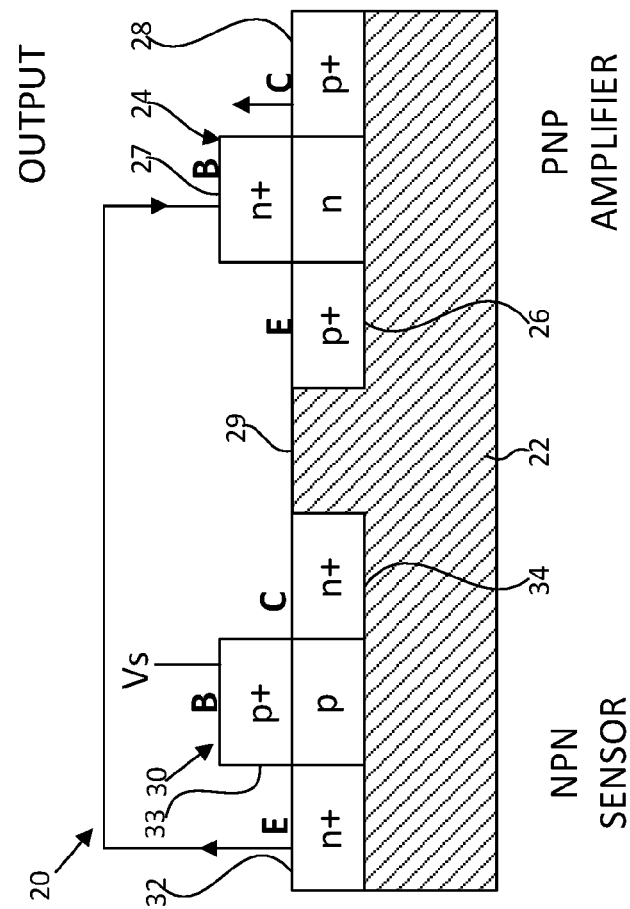
FIG. 1 is a schematic, cross-sectional view depicting an exemplary complementary lateral bipolar junction transistor (BJT) dosimeter structure.

FIG. 1 is a cross-sectional view schematically depicting a portion of an exemplary complementary lateral BJT dosimeter 20. The dosimeter 20 includes a substrate on which a buried oxide (BOX) layer 22 is formed. A first lateral bipolar junction transistor functional as a PNP amplifier 24 includes emitter, base and collector regions 26, 27, 28. The base regions include highly doped contacting regions and lesser doped regions having the same conductivity types as the adjoining contact regions. A second lateral bipolar junction transistor functional as an NPN sensing device 30 also includes emitter, base and collector regions 32, 33, 34. The emitter 32 (output) of the sensing device 30 is electrically connected to the base 27 (input) of the amplifier 24. The transistors are electrically isolated on the substrate by an STI region 29 that extends down to the BOX layer 22. In embodiments wherein an NPN LBJT functions as a sensing device, the emitter current is affected by positive oxide charges created by ionizing radiation. The complementary PNP amplifier used in such embodiments is essentially unaffected by such charges.

Figure 2:
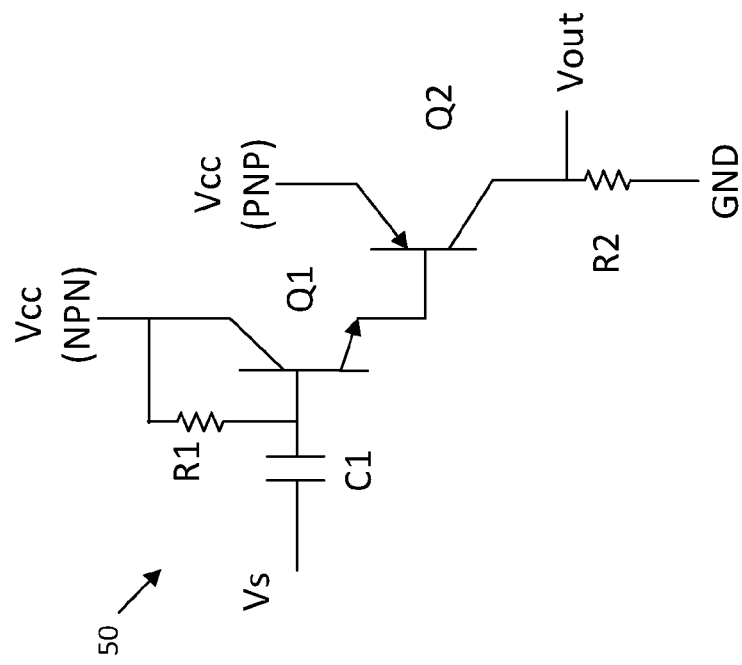
FIG. 2 is an electrical schematic diagram including the exemplary bipolar junction transistor (BJT) dosimeter structure.

With reference now to FIG. 2, an electrical schematic diagram depicts at least a portion of an exemplary sensor circuit 50. The sensor circuit 50 includes a first NPN lateral BJT, Q1, configured as a sensing device, and a second PNP lateral BJT, Q2, configured as an amplifying device. The base of transistor Q1 is configured to receive an input sense signal, VS, via a series-coupled capacitor C1. Specifically, the base of Q1 is connected with a first terminal of a capacitor C1 and a second terminal of C1 is adapted to receive sensing signal VS. The base of transistor Q1 is also connected with a supply voltage source, VCC(NPN), through a first resistor, R1. The collector of transistor Q1 is connected with the voltage source VCC(NPN). The voltage source VCC, in conjunction with a value of resistor R1, sets the quiescent base voltage of the lateral BJT transistor Q1. The capacitor C1 serves to couple the sensing signal VS to the base of the sensing bipolar transistor Q1. The value of C1 is determined as a function of the thickness of the sensor insulator covering the base of transistor Q1. The thickness of the sensor insulator is preferably between about 2 nm and 300 nm, although the disclosed embodiments are not limited to any particular dimensions of the sensor insulator. In general, if the charges being sensed are located on the sensor insulator surface, the sensor insulator should be on the thin side of the range (2 to 10 nm) in order to achieve a large sensing signal VS. If the charges being sensed are located in the bulk of the sensor insulator, e.g. charges generated within the sensor insulator by ionizing radiation, the sensor insulator should be on a thicker portion of the range (for example, 10 to 100 nm) in order to achieve a large sensing signal VS.

The output (emitter) of transistor Q1 is connected with the input (base) of the PNP lateral bipolar junction transistor Q2. The output (collector) of transistor Q2 is connected to an electrical ground GND through a resistor R2. The amplified output VOUT from the transistor Q2 can be connected to other electronic circuits (not shown) for processing. The emitter of transistor Q2 is connected with a second supply voltage source, which is VCC(PNP) in this embodiment. An amplified sense signal, VOUT, is generated as an output of the sensor circuit 50 at the collector of transistor Q2. Values for R1 and R2 are typically between about 1 kΩ and 10 kΩ, although embodiments as disclosed herein are not limited to any particular resistance values for R1 and R2.

In terms of operation of sensor circuit 50, when sensing an environmental condition or other detectable factor such as ionizing radiation, the sense signal VS induces a slight change in the surface potential in the base region of the NPN transistor Q1, which in turn causes a change in the emitter current in Q1. This change in emitter current in transistor Q1 is amplified by the PNP transistor Q2 by a factor of β, the current gain of Q2. For a homojunction bipolar transistor device, β is about 50, while for a heterojunction bipolar transistor device (which typically uses differing semiconductor materials for the base and emitter regions), β can be about 500 or larger.

As previously stated, the sense signal generated by a sensor is conventionally very small in amplitude and is therefore highly susceptible to noise and other signal corruption factors. A sensor according to one or more embodiments disclosed herein provides an amplified sense signal as an output thereof and is thereby able to beneficially achieve a superior signal-to-noise ratio (SNR) compared to standard sensors. Moreover, the amplifying transistor is substantially unaffected by the detected radiation.

Figure 3:
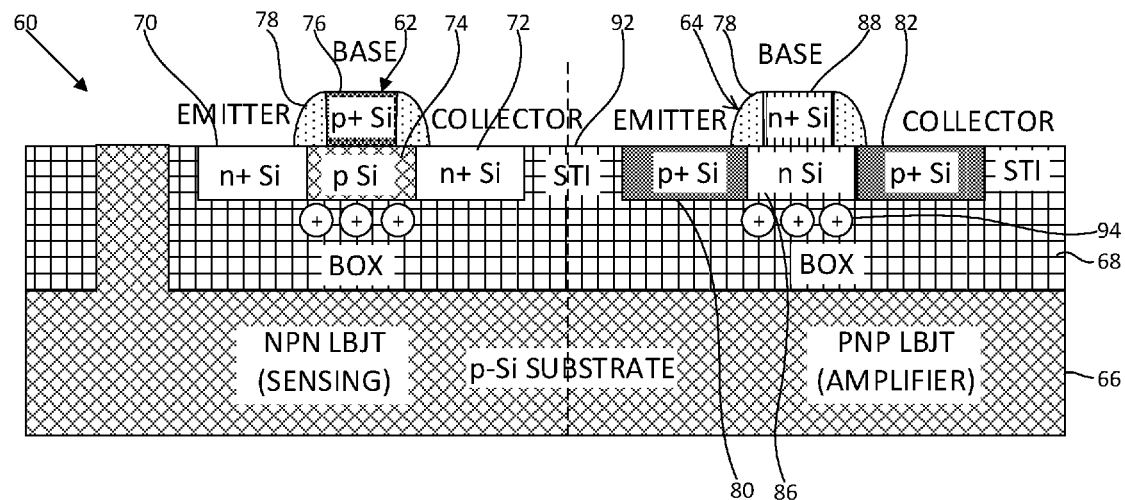
FIG. 3 is a schematic, cross-sectional view depicting a first exemplary complementary lateral bipolar junction transistor (BJT) dosimeter structure formed on a silicon-on-insulator (SOI) substrate.

FIG. 3 shows a first exemplary embodiment of a complementary lateral bipolar junction transistor dosimeter 60. The electrical connections of the exemplary dosimeter 60 are described above with respect to FIGS. 1 and 2. Such connections are omitted from FIG. 3 for purposes of more clearly showing other elements of the dosimeter. In this exemplary embodiment, an NPN lateral bipolar junction transistor 62 and a PNP lateral bipolar junction transistor 64 are both formed on a silicon-on insulator substrate that includes a lightly doped p-type silicon substrate layer 66 and a buried oxide (BOX) layer 68. A crystalline silicon layer (SOI layer) on the BOX layer 68 is used to form the LBJT devices. As used herein, the term "crystalline" refers to single-crystalline (mono-crystalline) and/or poly-crystalline (multi-crystalline). Laterally-spaced regions 70 and 72 of n+ conductivity type formed in the SOI layer, proximate an upper surface of the SOI layer, form an emitter and a collector, respectively, of the SOI NPN LBJT device. As used herein, "n-type" refers to the addition of impurities that contribute free electrons to an intrinsic semiconductor. In a silicon containing substrate, examples of n-type dopants, i.e. impurities, include but are not limited to antimony, arsenic and phosphorous. The n+ silicon regions have donor concentrations exceeding $1 \times 10^{19}$ $cm^{-3}$ in one or more embodiments. A region 74 of p-type conductivity is formed in the upper surface of the SOI layer between the regions 70 and 72. The p-type region 74 has acceptor concentration less than $1 \times 10^{19}$ $cm^{-3}$. For proper device operation, the doping concentration of the base region 74 should be smaller than the doping concentration of the emitter region 70 by a factor larger than ten (10). The p-type region 74, which essentially forms a base of the SOI LBJT device, is laterally adjacent to the n+ regions 70, 72 thereby forming respective base-emitter and base-collector p-n junctions. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium.

An extrinsic base of the NPN LBJT 62 includes a p+ conductivity structure 76 formed on and electrically contacting at least a portion of an upper surface of the base region 74. In the illustrated example, the extrinsic base structure 76 has a higher doping concentration compared to the base 74 formed from the SOI layer. The extrinsic base structure 76 is self-aligned with the base region 74, thus lowering base resistance. The extrinsic base structure 76 is electrically shielded from adjacent emitter and collector terminals/contacts (not explicitly shown, but implied) by insulating (e.g. nitride) spacers 78 formed on sidewalls of the extrinsic base structure. In the exemplary NPN BJT 62, the emitter-base junction is forward-biased and the collector-base junction is zero or reverse-biased for proper functioning of the LBJT device. In this embodiment, the emitter and collector are formed of n-type conductivity material while the base is formed of p-type conductivity material, and therefore the transistor 62 is considered an NPN device. In contrast, the emitter 80 and collector 82 of the transistor 64 are formed of a p-type conductivity material and the base 86 is formed of an n-type conductivity material, thereby resulting in a PNP lateral BJT device. An n+ conductivity structure 88 is formed between spacers 78 on the base 86 of the transistor 64. The complementary transistors 62, 64 are electrically isolated on the substrate by a shallow trench isolation (STI) region 92. As shown in the figure, positive oxide charges 94 are created by the passage of ionizing radiation in the BOX layer 68, which depletes the base region 74 of the NPN transistor 62, leading to lower barrier for electron injection from the emitter 70 into the base 74 and increased collector current that is suitable for detecting radiation. The collector current can, for example, be used to gauge radiation dose in the context of a radiation sensing application. The positive charges 94 generated by ionizing radiation and trapped in the BOX layer have an equivalent effect of a positive substrate bias on the electric field distribution. The same mechanism applies to the case when an oxide layer is on top of the base region of an inverted lateral BJT, which could be built on both SOI and bulk silicon substrates as discussed further below.

Oxide charges created in the BOX layer beneath the PNP transistor 64 accumulate electrons in the n-type base 86 and have no effect on the bipolar junction transistor characteristics of the transistor 64, thereby making it suitable for amplification without performance degradation when subjected to ionizing radiation. The complementary transistors 62, 64 provide built-in sensing and signal amplification, respectively, having potential for detecting a variety of high energy particles, including neutrons, gamma rays, x-rays, protons and alpha particles. In some embodiments, the device is unpowered until a readout is desired or required, as for the case of a personal dosimeter or in-situ dose radiation monitors for monitoring patient exposure in medical environments. Radiation information can be stored in the device 60 and is read out at a later time in some embodiments. In other embodiments, the sensing devices with built-in signal amplification, such as the exemplary device 60 as discussed above, are powered and embedded into electronic circuits where the output current is used to power on or off circuit functions as desired.

Figure 4:
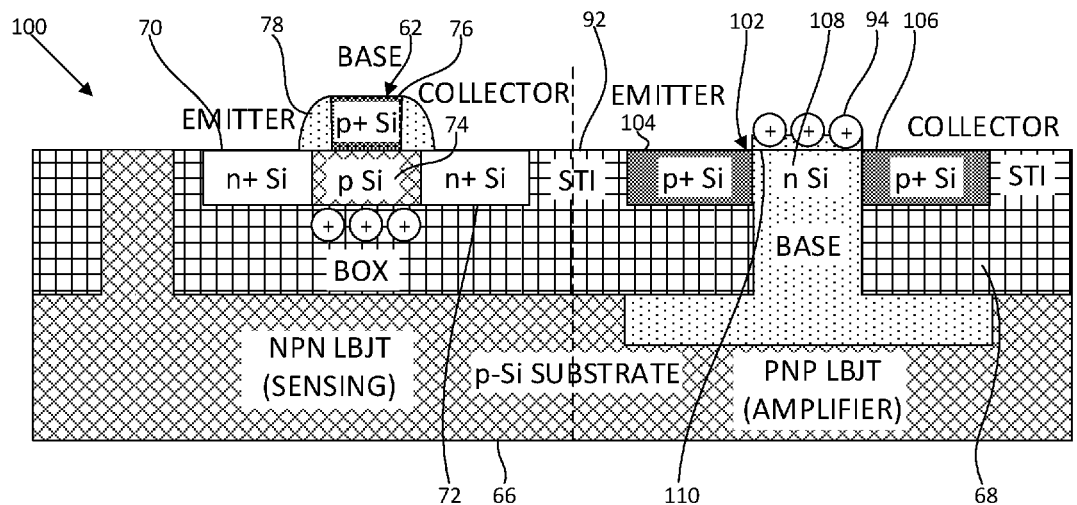
FIG. 4 is a schematic, cross-sectional view depicting a second exemplary complementary lateral bipolar junction transistor (BJT) dosimeter structure formed on a silicon-on-insulator (SOI) substrate and including a PNP inverted LBJT.

A second exemplary embodiment of a complementary lateral BJT dosimeter 100 is schematically illustrated in FIG. 4. Like the dosimeter 60 described above, the elements of the monolithic device are formed on a SOI substrate. The same reference numerals are used in both FIGS. 3 and 4 to designate similar or identical elements. The sensing portion, including the lateral bipolar junction transistor 62, is the same in both exemplary dosimeters 60, 100. The NPN transistor 62 in the exemplary dosimeter 100 is electrically connected to a PNP inverted lateral bipolar junction transistor 102. The transistor 102 includes p+ emitter and collector regions 104, 106 and an n-type base 108. A dielectric layer 110 is formed directly on the top surface of the base 108. The BOX layer 68 and the dielectric layer 110 may or may not be comprised of the same material. In some embodiments, both layers 68, 110 consist essentially of silicon dioxide. In operation, charges 94 are created by ionizing radiation in the BOX layer 68 adjoining the NPN LBJT, which depletes the base region 74 thereof. This leads to lower barrier for electron injection from the emitter 70 into the base 74 and increased collector current that is suitable for detecting radiation. Charges 94 are also created in the top dielectric layer 110 on the PNP inverted LBJT 102, which accumulates electrons in the n-type base 108. Such accumulation has no effect on the characteristics of the transistor 102, which is accordingly suitable for amplification without performance degradation. Further details relating to the exemplary dosimeter 100 and its fabrication are provided below with respect to FIGS. 9-17.

Figure 5:
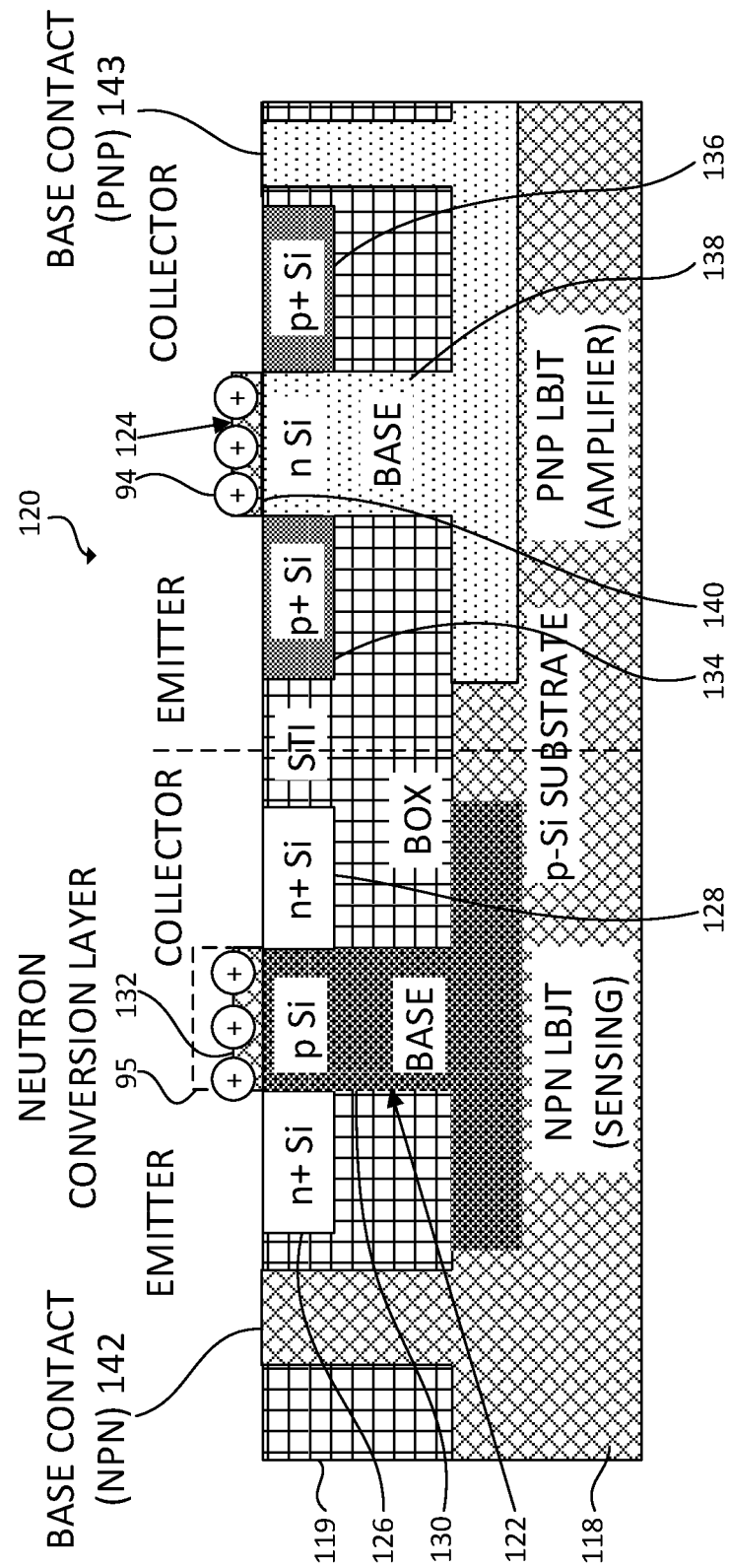
FIG. 5 is a schematic, cross-sectional view depicting a third exemplary complementary lateral bipolar junction transistor (BJT) dosimeter structure formed on a bulk silicon substrate and including a PNP inverted LBJT.

A third exemplary complementary lateral bipolar junction transistor dosimeter 120 is schematically illustrated in FIG. 5. The sensing LBJT and the amplifying LBJT are both formed on a bulk silicon substrate 118. No starting SOI substrate is required for this embodiment. The amplifier region of the exemplary dosimeter 120 is similar to that shown in FIG. 4. The substrate 118 has p-type conductivity. The sensing region of the exemplary embodiment includes an NPN inverted lateral bipolar junction transistor 122 that is electrically connected in the manner described above with reference to FIGS. 1 and 2 to the PNP inverted lateral bipolar junction transistor 124 in the amplifier region. The NPN transistor 122 includes n+ emitter and collector regions 126, 128 formed over a BOX layer 119 and a p-type base 130 extending through the BOX layer and adjoining the substrate 118. A dielectric layer 132 directly contacts the top surface of the base 130. The PNP inverted lateral bipolar junction transistor 124 includes p+ emitter and collector regions 134, 136 adjoining the BOX layer 119 and an n-type base 138. A dielectric layer 140 directly contacts the top surface of the base 138. First and second base contacts 142, 143 extend from the sensing and amplifier regions of the substrate 118, respectively, and through the BOX layer 119. In operation, charges 94 are created in the dielectric (e.g. oxide) layer 132 of the NPN lateral BJT by ionizing radiation, which depletes the base 130 thereof, leading to lower barrier for electron injection from the emitter 126 into the base 130 and increased collector current. Positive charges 94 are also created in the dielectric layer 140 of the PNP LBJT, which accumulates electrons in the n-type base 138. Amplification is accordingly provided without performance degradation. In some embodiments, a neutron conversion layer 95 is formed on the dielectric layer 132 on the p-type base of the NPN transistor for neutron detection. The addition of the neutron conversion layer may improve the sensitivity of the device to neutrons. The dosimeter, being capable of detecting charged particles, and x-rays and gamma rays, may be capable of detecting neutrons without the conversion layer 95. For example, for detecting charges created by ionizing radiation, suitable materials for the sensing dielectric layer 132 include, but are not limited to SiO2, SiN, SiON (silicon oxynitride), BN (boron nitride), Al2O3, and 10B, 6Li, 3He, 157Gd (neutron conversion layer which produce charged particles when thermal neutrons impinge on these layers). In another embodiment, the neutron conversion layer could be a sheet of material 10B, 6Li,157Gd, or a gas cell with ultra-thin walls for 3He, placed on top of a device 60, 100 or 120, or under the p-type Si substrate (66 in FIG. 3-4, or 118 in FIG. 5) that has been thinned to about 2 µm (for 10B or 3He) or about 7 µm for 6Li. The efficiency of the NPN lateral BJT to neutrons depends on the degree to which the impinging neutrons are thermalized. A block of polyethylene or other plastic near the neutron conversion layer will thermalize some of the incident neutrons. The sensing dielectric layer 132 is formed, in one or more embodiments, using a deposition technique such as, for example, atomic layer deposition (ALD), CVD, sputtering, or the like, although other methods of forming the sensing dielectric layer are similarly contemplated. Omitted from FIGS. 3-5, merely for economy of description, are base, collector and emitter terminal connections for each of the transistors. Such terminal connections, as well as a local interconnect layer, are conventionally formed using a metallization step, as will be known by those skilled in the art.

By using an oxide as the sensing layer 132, superior charge retention is achieved. The sensor 120 can be readily configured for a particular sensing application/environment through appropriate structure and/or material engineering of the sensing layer 132. That is, by changing the material or dimensions used to form the sensing layer 132, the sensing transistor 122 (Q1 in FIG. 2) can be customized for sensing a desired environmental condition and/or material.

Moreover, the gain of the amplifying transistor Q2 (64 in FIG. 3, 102 in FIG. 4, 124 in FIG. 5), which affects the level of amplification of the sensing signal, can be controlled via material/device engineering. For instance, the gain of the amplifying transistor is controlled, in one or more embodiments, by controlling a doping ratio between the emitter and base of the amplifying transistor Q2. The emitter and collector regions are typically doped quite heavily, with doping concentrations above $1\times10^{20}$ per cm$^3$. The doping concentration of the base region can be also varied according to desired device characteristics. By way of example only and without limitation, by decreasing the base doping concentration of transistor Q2 from about $5\times10^{18}$ per cm$^3$ to $1\times10^{18}$ per cm$^3$, the current gain of transistor Q2 is increased by a factor of five.

Figure 6:
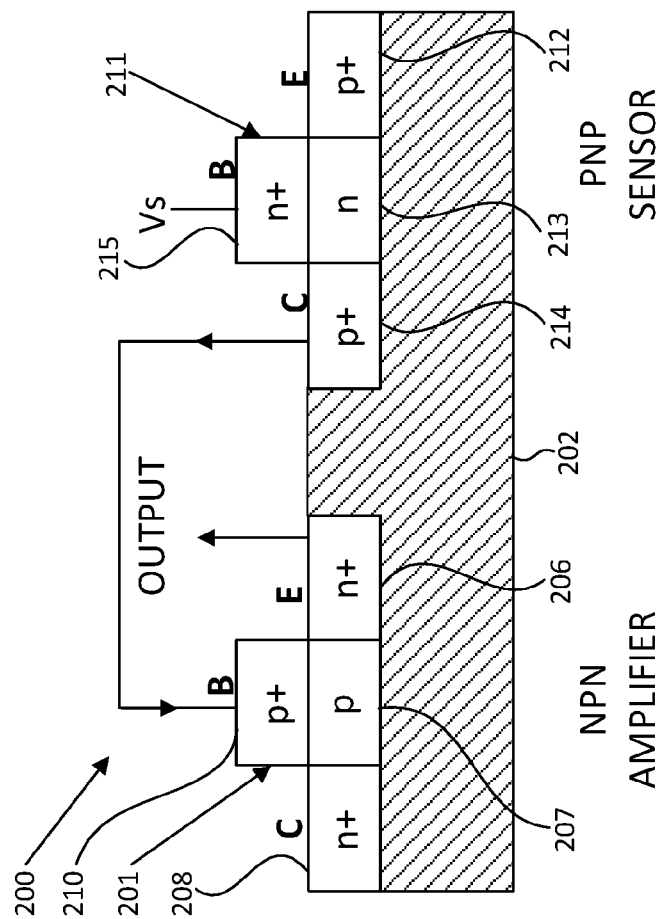
FIG. 6 is a schematic, cross-sectional view depicting an exemplary complementary lateral bipolar junction transistor (BJT) dosimeter structure configured for detecting negative charges.

FIG. 6 is a cross-sectional view schematically depicting a portion of an exemplary complementary lateral BJT dosimeter 200 configured for the detection of negative charges. The dosimeter 200 includes a silicon substrate having a buried oxide (BOX) layer 202. A first lateral bipolar junction transistor 201 functional as an NPN amplifier includes emitter (E), base (B) and collector (C) regions 206, 207, 208. A p+ contacting region 210 adjoins the base 207. An electrically isolated second lateral bipolar junction transistor 211 functional as a PNP sensing device also includes emitter, base and collector regions 212, 213, 214, the emitter and collector regions being p+ regions. An n+ contacting region 215 directly contacts the base region 213. The collector 214 (output) of the PNP sensing device is electrically connected to the p-type base 207 (input) of the NPN amplifier 201.

Figure 7:
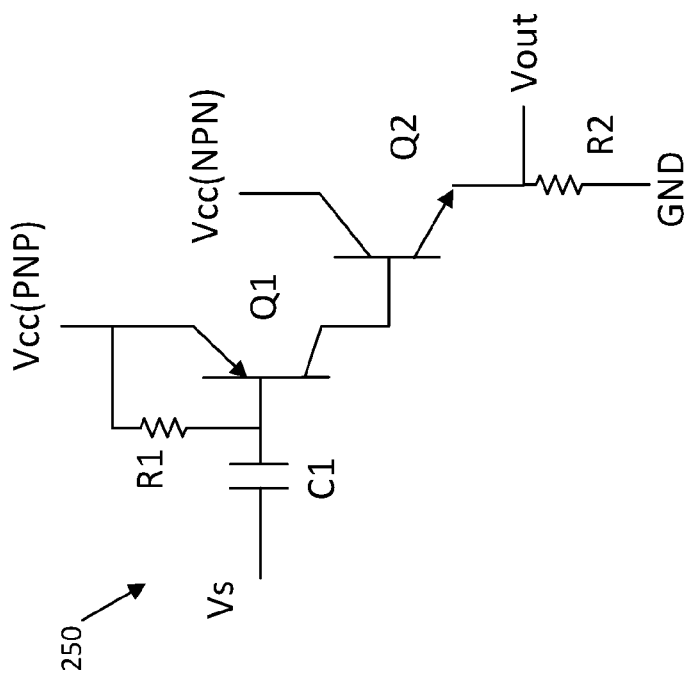
FIG. 7 is an electrical schematic diagram including the exemplary bipolar junction transistor (BJT) dosimeter structure configured for detecting negative charges.

With reference now to FIG. 7, an electrical schematic diagram depicts at least a portion of an exemplary sensor circuit 250. The sensor circuit 250 includes a first PNP lateral BJT, Q1, configured as a sensing device, and a second NPN lateral BJT, Q2, configured as an amplifying device. The base of transistor Q1 is configured to receive an input sense signal, VS, via a series-coupled capacitor C1. Specifically, the base of Q1 is connected with a first terminal of a capacitor C1 and a second terminal of C1 is adapted to receive the sensing signal VS. The base of transistor Q1 is also connected with a supply voltage source, VCC(PNP), through a first resistor, R1. The emitter of transistor Q1 is connected with the bias source VCC(PNP). The voltage source VCC, in conjunction with a value of resistor R1, sets the quiescent base voltage of the lateral BJT transistor Q1. The capacitor C1 serves to couple the sensing signal VS to the base of the sensing bipolar transistor Q1. The value of C1 is determined as a function of the thickness of the sensor insulator covering the base of transistor Q1. The thickness of the sensor insulator is preferably between about 2 nm and 300 nm, although the disclosed embodiments are not limited to any particular dimensions of the sensor insulator. In general, if the charges being sensed are located on the sensor insulator surface, the sensor insulator should be on the thin side of the range (for example, 2 to 10 nm) in order to achieve large sensing signal VS. If the charges being sensed are located in the bulk of the sensor insulator, e.g. charges generated within the sensor insulator by ionizing radiation, the sensor insulator should be in a thicker portion of the range (for example, 10 to 100 nm) in order to achieve large sensing signal VS.

The output (collector) of transistor Q1 is connected with the input (base) of the NPN lateral bipolar junction transistor Q2. The output (emitter) of transistor Q2 is connected to an electrical ground GND through a resistor R2. The amplified output VOUT from the transistor Q2 can be connected to other electronic circuits (not shown) for processing. The collector of transistor Q2 is connected with a second supply voltage source, which is VCC(NPN) in this embodiment. An amplified sense signal, VOUT, is generated as an output of the sensor circuit 250 at the emitter of transistor Q2. Values for R1 and R2 are typically between about 1 kΩ and 10 kΩ, although embodiments as disclosed herein are not limited to any particular resistance values for R1 and R2.

In terms of operation of sensor circuit 250, when sensing negative charges, the sense signal VS induces a slight change in the surface potential in the base region of the PNP transistor Q1, which in turn causes a change in the collector current in Q1. This change in collector current in transistor Q1 is amplified by the NPN transistor Q2 by a factor of β, the current gain of Q2. For a homojunction bipolar transistor device, β is about 50, while for a heterojunction bipolar transistor device (which typically uses differing semiconductor materials for the base and emitter regions), β can be about five hundred (500) or larger.

Figure 8:
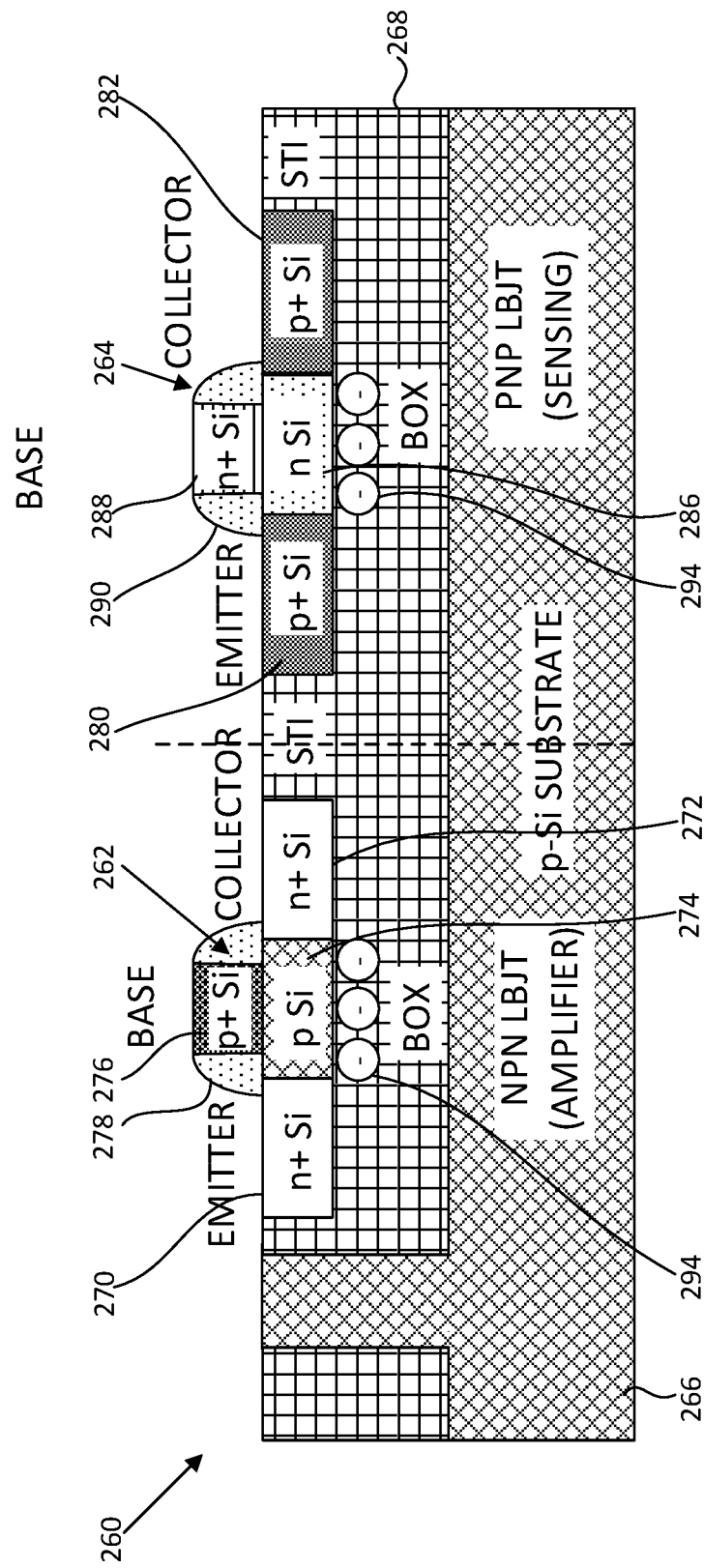
FIG. 8 is a schematic, cross-sectional view depicting the exemplary complementary lateral bipolar junction transistor (BJT) dosimeter structure for detecting negative charges formed on a silicon-on-insulator (SOI) substrate.

FIG. 8 shows an exemplary embodiment of a complementary lateral bipolar junction transistor dosimeter 260 configured for the detection of negative charges. The electrical connections of the exemplary dosimeter 260 are described above with respect to FIGS. 6 and 7. Such connections are omitted from FIG. 8 for purposes of more clearly showing other elements of the dosimeter. In this exemplary embodiment, an NPN lateral bipolar junction transistor 262 and a PNP lateral bipolar junction transistor 264 are both formed on a silicon-on insulator substrate that includes a lightly doped p-type silicon substrate 266 and a buried oxide (BOX) layer 268. A crystalline silicon layer (SOI layer) on the BOX layer 268 is used to form the LBJT devices 262, 264. Laterally-spaced regions 270 and 272 of n+ conductivity type formed in the SOI layer form an emitter and a collector, respectively, of the SOI LBJT device. The n+ silicon regions have donor concentrations exceeding $1'10^{19}$ cm$^{-3}$ in one or more embodiments. A region 274 of p-type conductivity is formed in the upper surface of the SOI layer between the regions 270 and 272. The p-type region 274, which essentially forms a base of the SOI LBJT device, is laterally adjacent to the n+ regions 270, 272 thereby forming respective base-emitter and base-collector p-n junctions. The p-type region 274 has acceptor concentration less than $1\times10^{19}$ cm$^{-3}$. For proper device operation, the doping concentration of the base region 274 should be smaller than the doping concentration of the emitter region 270 by a factor larger than ten (10). The base of the NPN LBJT 262 further includes a p+ conductivity structure 276 formed on and electrically contacting at least a portion of an upper surface of the p-type base region 274. In the illustrated example, the extrinsic base structure 276 has a higher doping concentration compared to the base 274. The extrinsic p+ base structure 276 is self-aligned with the p-Si base region 274, thus lowering base resistance. The extrinsic base structure 276 is electrically shielded from adjacent emitter and collector terminals/contacts (not explicitly shown, but implied) by insulating (e.g. nitride) spacers 278 formed on sidewalls of the extrinsic base structure.

The emitter 280 and collector 282 of the PNP transistor 264 to be used as a sensing device are formed of a p-type conductivity material and the base 286 is formed of an n-type conductivity material, thereby resulting in a PNP lateral BJT device having p+ emitter and collector regions and an n-type base. An n+ conductivity structure 288 is formed between spacers 290 on the base 286 of the PNP transistor 264. The complementary transistors 262, 264 are electrically isolated by a shallow trench isolation (STI) region 292. As shown in the figure, negative charges 294 are created by ionizing radiation in the BOX layer 268, which depletes the base region of the PNP transistor 264, leading to lower barrier for hole injection from the emitter 280 into the base 286 and increased collector current suitable for sensing negative charges.

Negative charges created in the BOX layer 268 beneath the NPN transistor 262 accumulate holes in the p-type base 274 and have no effect on the bipolar junction transistor characteristics of the transistor 262, thereby making it suitable for amplification without performance degradation. Complementary inverted NPN and/or PNP lateral BPJ transistors can be employed for sensing negative charges in one or more alternative embodiments.

By way of example only and without limitation, FIGS. 9-17 are cross-sectional views depicting exemplary processing steps/stages in the fabrication of one exemplary complementary lateral BJT dosimeter 100. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: P. H. Holloway et al., *Handbook of Compound Semiconductors: Growth, Processing, Characterization, and Devices,* Cambridge University Press, 2008; and R. K. Willardson et al., *Processing and Properties of Compound Semiconductors,* Academic Press, 2001, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Figure 9:
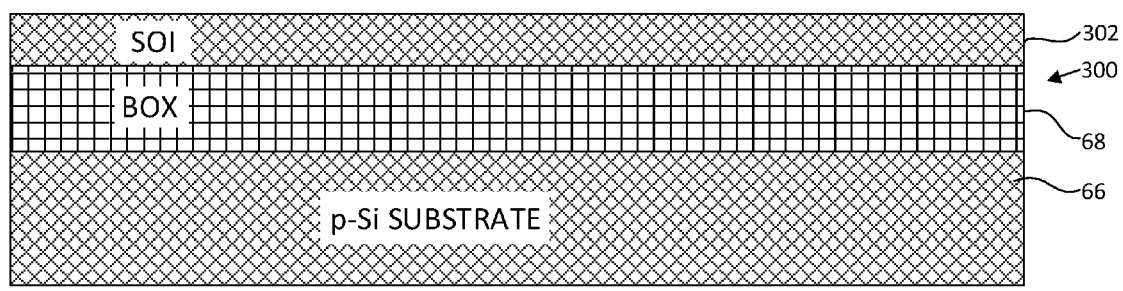
FIGS. 9-17 are cross-sectional views depicting exemplary steps/stages in the fabrication of the monolithic dosimeter shown in FIG. 4.

An exemplary sensor fabrication employs a semiconductor-on-insulator substrate 300 as schematically illustrated in FIG. 9. The substrate 300 includes a substrate layer 66. The substrate layer comprises a doped semiconductor material such as silicon that is p-type in the exemplary embodiment. It will be appreciated that the principles expressed in the present disclosure can be applied using other semiconductor materials, including but not limited to silicon germanium and group III-V semiconductor materials. The substrate layer 66 can be several microns or more in thickness and can function as a handle as well as facilitate subsequent CMOS processing. The substrate 300 further includes a crystalline silicon layer 302. The silicon (SOI) layer 302 can either be mono-crystalline or polycrystalline. The substrate layer 66 has an acceptor concentration between about $1 \times 10^{14}$ cm$^{-3}$ and $1 \times 10^{16}$ cm$^{-3}$ in one or more embodiments. The exact doping level of the substrate layer 66 is not critical. An electrically insulating layer 68 such as a buried oxide (BOX) layer is provided between the substrate layer 66 and the SOI layer 302. Silicon dioxide is among the materials that may be employed to form the electrically insulating layer 68. Other buried insulators such as boron nitride (BN) and aluminum oxide ($Al_2O_3$) may alternatively be employed to form the BOX layer in some embodiments. Depending on the electronic circuitry to be formed, the thickness of the crystalline semiconductor layer (SOI layer) 302 can be in the range of 10 nm to 1000 nm. The preferred thickness for most applications is in the range of 30 nm to 150 nm. Various methods of fabricating semiconductor-on-insulator (SOI) substrates as employed in one or more embodiments are known, one of which is Separation-by-Implanted Oxygen (SIMOX), wherein oxygen ions are implanted into a single crystal silicon substrate to form a BOX film. Another method of forming an SOI substrate is through the SMART CUT® method and wafer bonding, wherein two semiconductor substrates with silicon oxide surface layers are bonded together at the silicon oxide surfaces to form a BOX layer between the two semiconductor substrates. Doping of SOI substrates can be adjusted during fabrication. SOI substrates are commercially available. For applications where a neutron conversion layer for enhancing sensing is desired, the neutron conversion layer can be incorporated into the BOX layer prior to bonding. The BOX layer between the two semiconductor substrates in some embodiments consists essentially of a stack of silicon oxide, neutron conversion layer, silicon oxide.

Figure 10:
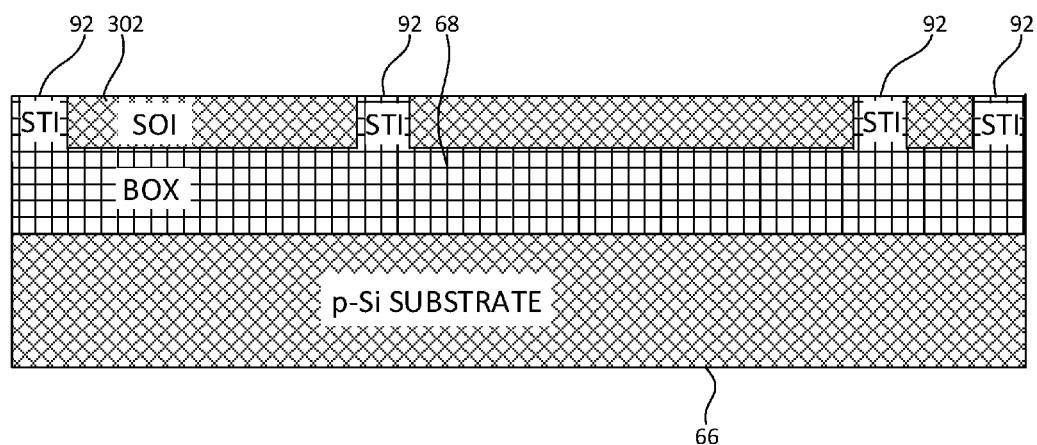

With reference to FIG. 10, shallow trench isolation (STI) regions 92 are formed. Although not explicitly shown, during the STI process, a pattern of trenches is etched, as defined by exposed portions of a hard mask layer, through the SOI layer 302 and partially into the underlying BOX layer 68. One or more dielectric materials (e.g., silicon dioxide) are deposited, for example, by chemical vapor deposition (CVD), to fill the trenches, and the excess dielectric material is removed using a planarization technique such as, for example, chemical-mechanical polishing (CMP). The STI regions 92 will provide electrical isolation between adjacent lateral BJT devices formed on the common substrate 300. In alternative embodiments, other methods of electrically isolating the lateral transistors on the substrate may be used.

Figure 11:
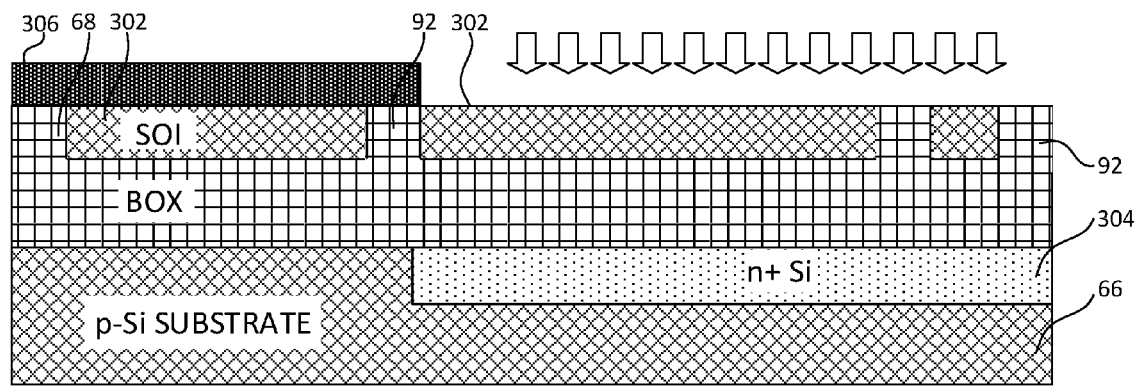
Figure 12:
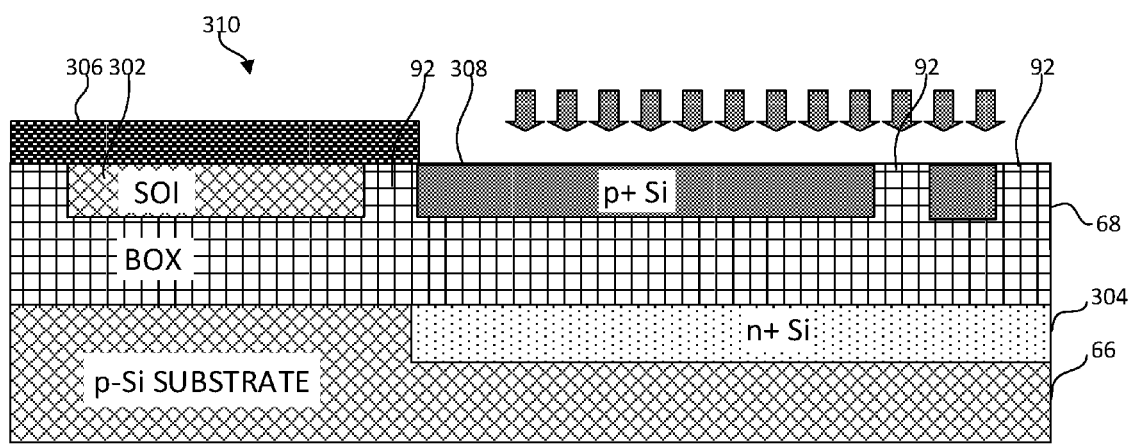

Next, a highly doped n+ region 304 is formed in the substrate layer 66 just beneath the BOX layer 68, as shown in FIG. 11. The region 304 provides electrical connection to the base of the inverted PNP, and therefore should be heavily doped. In practice, a doping level greater than $1 \times 10^{18}$ cm$^{-3}$ is desired for region 304. In one or more embodiments, the n+ region 304 is formed using a patterned mask 306 (e.g., silicon dioxide or photoresist layer) to protect the active region(s) used to form the lateral BJT device having the opposite polarity of the device to be formed in the active region including the n+ region 304. An n-type impurity or dopant (e.g., phosphorous) of a prescribed concentration level is implanted into the defined region, as schematically illustrated by an array of arrows. The impurity concentration as a function of depth within the substrate may be controlled by operating parameters including the ion dose and ion energy employed during implantation, as known in the art. A p-type impurity or dopant (e.g. boron) is then implanted to form p+ region(s) 308 in the SOI layer 302 on the opposite side of the BOX layer from the n+ region 304. A high-temperature anneal is performed to activate the dopants in the implanted regions. Commonly used anneal processes include rapid thermal anneal and furnace anneal. A structure 310 as schematically illustrate in FIG. 12 is accordingly obtained.

Figure 13:
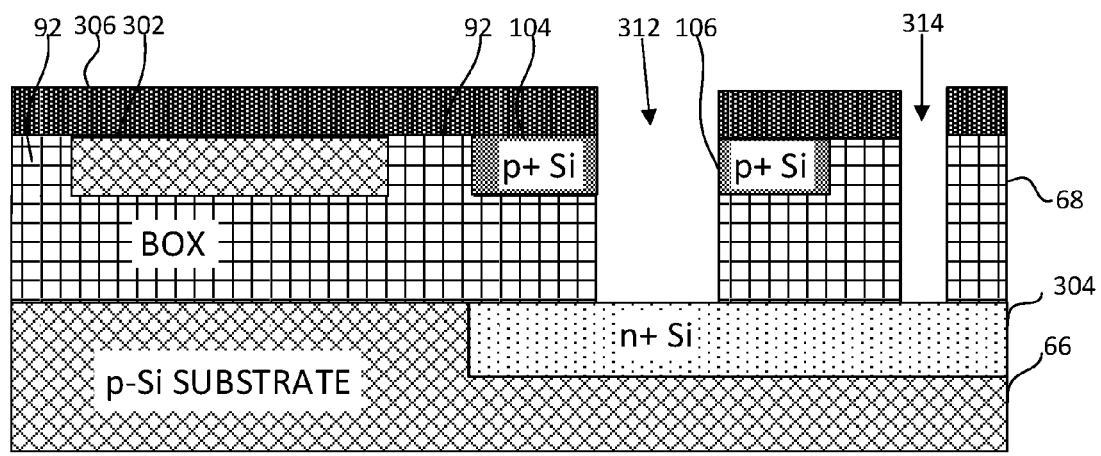
Figure 14:
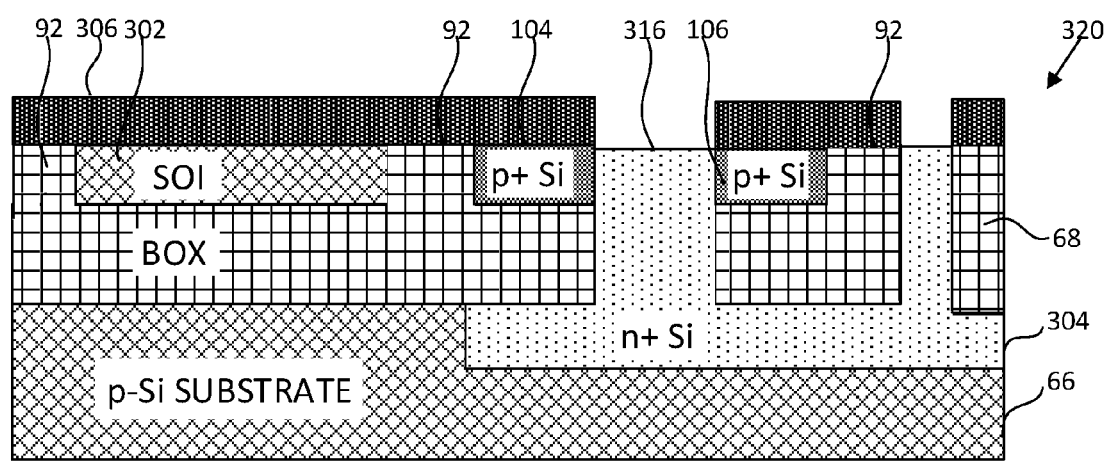

Referring to FIG. 13, a mask layer 306 completely covers one active region of the substrate while the portion of the mask layer on the active region including the p+ region is patterned. The patterning of the mask layer 306 exposes portions of the p+ region 308 formed in the SOI layer 302, as discussed above with respect to FIG. 12. The exposed portions are subjected to reactive ion etch (RIE) to form trenches 312, 314 down to the n+ region 304 within the substrate layer 66. For example, silicon can be selectively etched using HBr plasma, and oxide can be selectively etched using $CHF_3/Ar$ plasma. The p+ region is accordingly divided into two opposing p+ regions 104, 106 that will form the emitter and collector regions of a subsequently formed PNP lateral bipolar junction transistor. The n-type silicon material 316 that forms the base of the PNP lateral bipolar junction transistor is formed in the trench 312 between the p+ regions 104, 106 (e.g., using a selective epitaxial silicon growth process) in one or more embodiments. The n-type silicon material 316 can be in situ doped during selective epitaxial growth. The n-type silicon material also fills the parallel trench 314 that later functions as a base contact for the PNP lateral bipolar junction transistor. Both the base contact and base are in direct contact with the implanted n+ region 304. FIG. 14 shows a structure 320 obtained upon deposition of the n-type silicon material in the trenches 312, 314.

Figure 15:
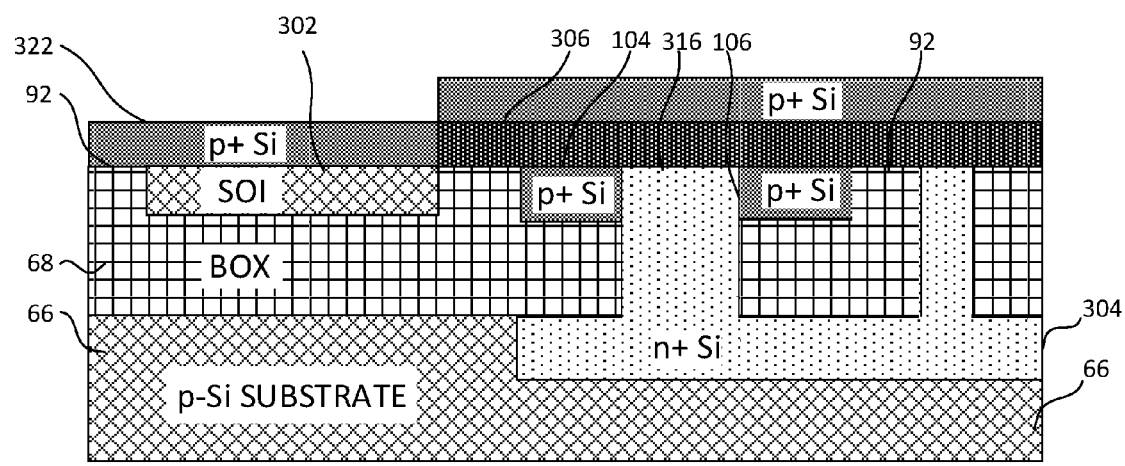
Figure 16:
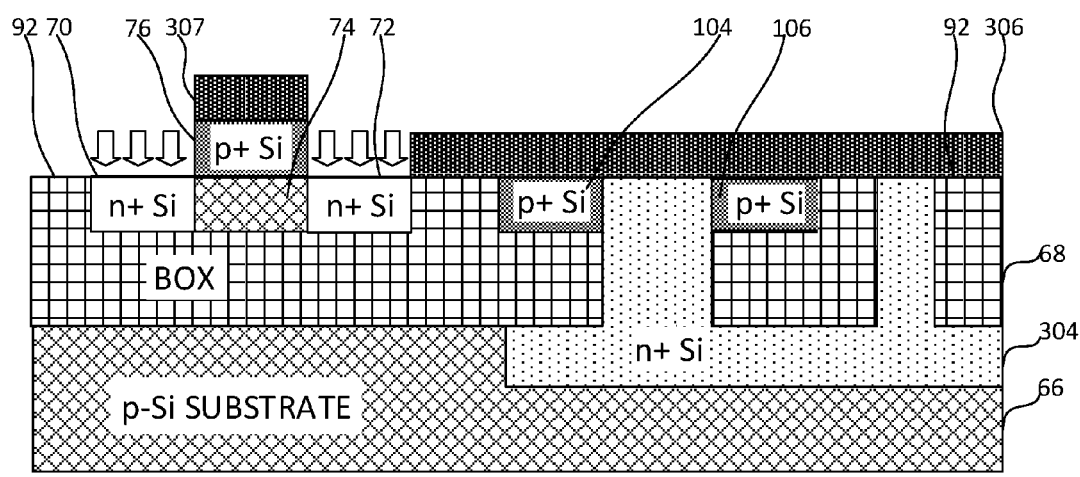

Subsequent to the steps leading up to FIG. 14, the mask layer 306 is removed, and a new mask layer 306 is then deposited. This is then followed by patterning the new mask layer 306 to protect the region forming the PNP transistor, but exposing the region for forming the NPN transistor. The exposed region of layer 302 is then doped p-type by ion implantation. A p+ doped layer 322 of polysilicon or poly-Si/SiGe is then deposited over the entire structure. The structure at this stage is as shown in FIG. 15.

A mask 307 is formed and patterned on the p+ layer 322. The unprotected portions of the p+ layer 322 are then removed to obtain the p+ base contacting region 76 of the NPN transistor. The doping concentration of the underlying p-type SOI layer, which forms the base 74 of the NPN transistor, is less compared to the doping concentration of the p+ region 76. A reactive ion etch can, for example, be used to remove the p+ layer and re-expose portions of the SOI layer 302. The re-exposed portions of the SOI layer are subjected to ion implantation (represented by arrows in FIG. 16) to form a pair of n+ regions on either side of the p-type base 74. The n+ regions adjoining the base 74 comprise emitter and collector regions 70, 72 of the NPN transistor. Ion implantation of dopants such as phosphorus atoms is followed by annealing.

Figure 17:
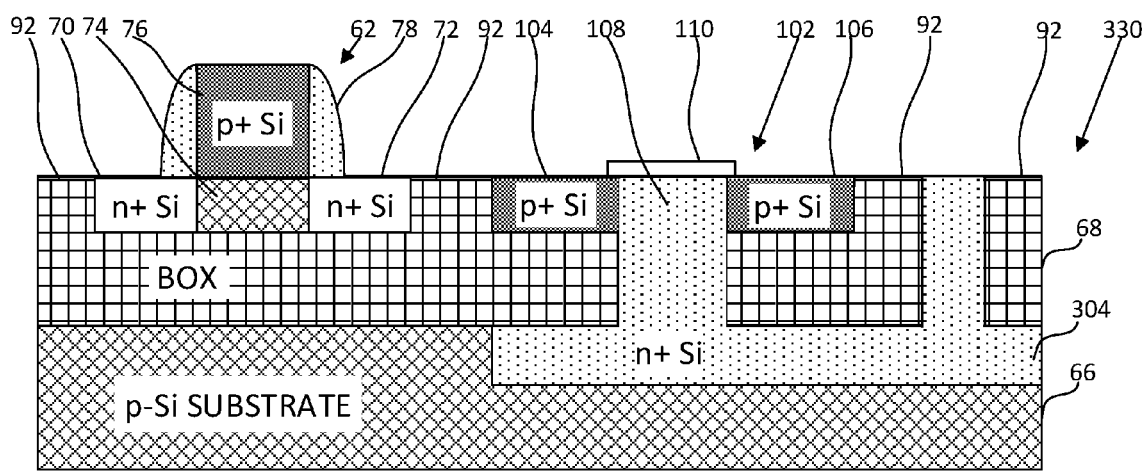

Spacers 78 are formed on the sidewalls of the p+ silicon contacting region 76. Spacers can be formed on sidewalls of the contacting region by deposition of a conformal dielectric material layer such as silicon nitride followed by an anisotropic etch. In one or more embodiments, a silicon nitride layer is deposited on an upper surface of the structure using, for example, chemical vapor deposition (CVD), although other materials and processes for forming the nitride layer are similarly contemplated by, and within the scope of, embodiments of the present disclosure. Patterning and etching steps familiar to those of skill in the art can be employed for forming the spacers. An electrically insulating layer 110 is formed on the n+ base 108. In one or more embodiments, the electrically insulating layer 110 comprises a high-dielectric constant (high-k) insulating material, such as, for example, hafnium oxide ($HfO_2$), tantalum oxide ($Ta_2O_5$), or dual-layer silicon dioxide ($SiO_2$)/high-k film. The layer 110 is formed, in one or more embodiments, using a deposition technique such as atomic layer deposition (ALD), CVD, sputtering, or the like, although other methods of forming the layer are similarly contemplated. A structure 330 as shown in FIG. 17 is accordingly obtained. FIG. 4 also schematically shows the structure 100 of FIG. 17 upon creation of charges once the dosimeter is subjected to ionizing radiation. In an alternative embodiment of the process, the sensing transistor is also formed as an inverted transistor wherein the base extends through the BOX layer 68 and a sensing structure including a dielectric layer is formed on the base. The base of the sensing transistor can be formed in the same manner as the base of the amplifying transistor, only the filling material is p+ rather than n+. A structure similar to that shown in FIG. 5 would accordingly be obtained. A neutron conversion layer 95 is formed on the dielectric layer in some embodiments for neutron detection. While the exemplary process is described as using a silicon-on-insulator substrate, it will be appreciated that the process can be adapted to form the complementary lateral bipolar junction transistors on a bulk silicon substrate.

A passivation layer (not shown) is formed to protect integrated circuit elements formed on the substrate from subsequent processing steps. In some embodiments, the passivation layer is formed of nitride, oxide, oxynitride, silicon dioxide, polymer (e.g., polyimide or polybenzoxazole), or other dielectric materials. In some embodiments, the passivation layer comprises a combination of dielectric materials. In one or more embodiments, additional passivation layers are formed over interconnect structures (not explicitly shown, but implied). The passivation layer is formed using methods such as, but not limited to, CVD, plasma-enhanced CVD (PECVD), spin-on, and other applicable methods known by those skilled in the art.

Given the discussion thus far, it will be appreciated that, in general terms, an exemplary integrated sensor for detecting radiation includes a sensing structure and first and second lateral bipolar junction transistors (BJTs). The first lateral BJT has a base that is electrically coupled to the sensing layer and is configured to generate an output signal indicative of a change in stored charge in the sensing layer. The second lateral BJT is configured to amplify the output signal of the first bipolar junction transistor. The first and second lateral BJTs are laterally adjacent to one another, have opposite polarities (i.e. one is PNP and the other is NPN), and are formed on a common substrate, thereby providing a monolithic structure. Some exemplary integrated sensors include sensing structures comprising a BOX layer 68, as employed in the dosimeters 60, 100, 260 shown in FIGS. 3, 4 and 8, respectively. Other exemplary integrated sensors include a dielectric layer 132 with or without a neutron conversion layer 95 as employed in the dosimeter described with respect to FIG. 5. In some embodiments, such as those described above with respect to FIGS. 1-5, the first or sensing transistor is NPN and the second or amplifier transistor is PNP. In contrast, the sensing transistor in the embodiments of FIGS. 6-8 is PNP while the amplifier transistor is NPN. The first lateral bipolar junction transistor, the second lateral bipolar junction transistor and the substrate form a monolithic structure. Exemplary substrates include SOI substrates and bulk substrates. One or both of the first and second lateral bipolar junction transistors can be inverted. A base of the second lateral bipolar junction transistor is electrically connected to an output terminal of the first lateral bipolar junction transistor. FIGS. 1, 2 and 6, 7 include exemplary circuit diagrams showing such connections. The first and second LBJTs are formed in electrically isolated regions of the substrate and are separated by shallow trench isolation (STI) regions in some embodiments.

Given the discussion thus far, it will also be appreciated that an exemplary method for fabricating an integrated sensor includes obtaining a substrate including a substrate layer, a semiconductor layer, and an electrically insulating layer between and adjoining the substrate layer and the semiconductor layer, and forming a first lateral bipolar junction transistor having a first polarity on the substrate. FIGS. 9-16 illustrate exemplary steps for obtaining a structure including a first lateral bipolar junction transistor on an SOI substrate. The first lateral bipolar junction transistor is configured to generate an output signal indicative of a change in stored charge in the electrically insulating layer (the BOX layer in FIG. 16) resulting from ionizing radiation. The method further includes forming a second lateral bipolar junction transistor having a second polarity opposite to the first polarity on the substrate, the second bipolar junction transistor being configured to amplify the output signal of the first bipolar junction transistor. FIGS. 11-17 show exemplary steps for forming the second lateral bipolar junction transistor. The first and second bipolar junction transistors are formed adjacent to one another on the substrate. An electrical connection is formed between an output terminal of the first lateral bipolar junction transistor and a base of the second lateral bipolar junction transistor. One or more interconnect layers are formed in some embodiments using conventional metallization schemes to provide such connections.

A further exemplary method for fabricating a sensor includes obtaining a semiconductor substrate, forming a first lateral bipolar junction transistor having a first polarity on the semiconductor substrate, and forming a sensing structure on a base of the first lateral bipolar junction transistor. The first lateral bipolar junction transistor is configured to generate an output signal indicative of a change in stored charge in the sensing structure. The method further includes forming a second lateral bipolar junction transistor having a second polarity opposite to the first polarity on the semiconductor substrate. For example, if the first lateral bipolar junction transistor is NPN, the second will be PNP. The second lateral bipolar junction transistor is configured to amplify the output signal of the first lateral bipolar junction transistor. The first and second lateral bipolar junction transistors are formed adjacent to one another on the substrate. An electrical connection is formed between an output terminal of the first lateral bipolar junction transistor and a base of the second lateral bipolar junction transistor. The substrate may or may not be an SOI substrate. The exemplary fabrication described with reference to FIGS. 9-17 could be modified to form an inverted sensing transistor as well as an inverted amplifier transistor. Alternatively, only the sensing transistor could be formed as an inverted LBJT. A structure such as shown in FIG. 5 could accordingly be fabricated wherein the sensing structure (dielectric layer 132 possibly combined with a neutron conversion layer 95 on top of the dielectric layer) is formed on the base of an inverted LBJT. In some embodiments, the complementary LBJTs are formed using an SOI substrate. The emitter and collector regions of both complementary transistors are formed within the SOI layer in one or more exemplary embodiments.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having sensor devices therein formed in accordance with one or more of the exemplary embodiments.

An integrated circuit in accordance with aspects of the present disclosure can be employed in essentially any application and/or electronic system involving sensors that can detect and provide relevant environmental information, such as, but not limited to, radiation levels, inorganic particles, biological and/or chemical entities, etc. Suitable systems for implementing one or more exemplary embodiments may include, but are not limited to, personal radiation dosimeters, passive detectors with no power required except for read, powered detectors incorporated into existing infrastructure such as real time monitoring systems with warning systems and/or shut-down procedures when the dose rate exceeds critical levels, and detectors having sensitivity to different incident particles (e.g. ray/gamma ray vs. alpha particles or neurons). Exemplary dosimeters are provided herein could further be used in dosimeter systems to measure dose delivered in situ during, for example, ion implantation. Dose uniformity can be detected by using an array of sensors as disclosed herein. Systems incorporating such integrated circuits are considered part of this disclosure. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment (s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a sensor for detecting radiation comprising:
   obtaining a substrate including a substrate layer, a semiconductor layer, and an electrically insulating layer between and adjoining the substrate layer and the semiconductor layer;
   forming a first lateral bipolar junction transistor having a first polarity on said substrate, the first lateral bipolar junction transistor being configured to generate an output signal indicative of a change in stored charge in the electrically insulating layer resulting from ionizing radiation;
   forming a second lateral bipolar junction transistor having a second polarity opposite to the first polarity on said substrate, the second bipolar junction transistor being configured to amplify the output signal of the first bipolar junction transistor, the first and second bipolar junction transistors being formed adjacent to one another on the substrate, and
   forming an electrical connection between an output terminal of the first lateral bipolar junction transistor and a base of the second lateral bipolar junction transistor.

2. The method of claim 1, wherein the substrate comprises silicon and the electrically insulating layer is a buried oxide layer.

3. The method of claim 2, wherein forming the first lateral bipolar junction transistor further includes forming first collector and first emitter regions within the semiconductor layer and forming the second lateral bipolar junction transistor further includes forming second collector and second emitter regions within the semiconductor layer.

4. The method of claim 3, further including the step of forming at least one of the first and second lateral bipolar junction transistors as an inverted lateral bipolar junction transistor.

5. The method of claim 1, wherein the first lateral bipolar junction transistor is an NPN transistor and the second lateral bipolar junction transistor is a PNP transistor.

6. A method of forming a sensor, comprising:
   obtaining a semiconductor substrate;
   forming a first lateral bipolar junction transistor having a first polarity on the semiconductor substrate;
   forming a sensing structure on a base of the first lateral bipolar junction transistor, the first lateral bipolar junction transistor being configured to generate an output signal indicative of a change in stored charge in the sensing structure;
   forming a second lateral bipolar junction transistor having a second polarity opposite to the first polarity on the semiconductor substrate, the second bipolar junction transistor being configured to amplify the output signal of the first bipolar junction transistor, the first and second bipolar junction transistors being formed adjacent to one another on the substrate, and
   forming an electrical connection between an output terminal of the first lateral bipolar junction transistor and a base of the second lateral bipolar junction transistor.

7. The method of claim 6, wherein the semiconductor substrate is a silicon-on-insulator substrate including a buried oxide layer, further including forming a base for the first lateral bipolar junction transistor through the buried oxide layer.

8. The method of claim 7, further including forming the base for the second lateral bipolar junction transistor through the buried oxide layer.

9. The method of claim 7, further including forming an emitter and the collector of the first lateral bipolar junction transistor within the substrate.

* * * * *